(12) United States Patent
Mouret et al.

(10) Patent No.: US 12,203,992 B2
(45) Date of Patent: Jan. 21, 2025

(54) TRANSCEIVER FOR TRANSMITTING AND RECEIVING SIGNALS AND METHOD FOR THE TRANSCEIVER

(71) Applicant: NXP USA, INC., Austin, TX (US)

(72) Inventors: Guillaume Mouret, Portet-sur-Garonne (FR); Tristan Bosvieux, Plaisance du Touch (FR); Laurent Bordes, Aucamville (FR)

(73) Assignee: NXP USA, Inc., Austin, TX (US)

( * ) Notice: Subject to any disclaimer, the term of this patent is extended or adjusted under 35 U.S.C. 154(b) by 205 days.

(21) Appl. No.: 18/160,686

(22) Filed: Jan. 27, 2023

(65) Prior Publication Data

US 2023/0251317 A1   Aug. 10, 2023

(30) Foreign Application Priority Data

Feb. 10, 2022 (EP) .................................. 22305150

(51) Int. Cl.
  *G01R 31/36* (2020.01)
  *G01R 31/382* (2019.01)
  *G01R 31/396* (2019.01)
  *G01R 35/00* (2006.01)

(52) U.S. Cl.
  CPC ....... *G01R 31/3644* (2013.01); *G01R 31/382* (2019.01); *G01R 31/396* (2019.01); *G01R 35/005* (2013.01)

(58) Field of Classification Search
  None
  See application file for complete search history.

(56) References Cited

U.S. PATENT DOCUMENTS

| 7,135,884 | B1 | 11/2006 | Talbot et al. |
| 9,929,866 | B2 * | 3/2018 | Darshan .................. H04L 12/10 |
| 10,666,254 | B2 | 5/2020 | Nguyen et al. |
| 2012/0235800 | A1 | 9/2012 | Hammerschmidt |
| 2013/0288614 | A1 | 10/2013 | Wu |
| 2016/0181911 | A1 * | 6/2016 | Knauss ............ G01R 19/16538 |
| | | | 315/307 |
| 2023/0025757 | A1 * | 1/2023 | Manikandan ...... H03K 19/0175 |

FOREIGN PATENT DOCUMENTS

WO   0154298 A1   7/2001

* cited by examiner

*Primary Examiner* — Jany Richardson (57) ABSTRACT

The present disclosure relates to a transceiver (100) comprising a first and second terminal, a signal generation unit a signal generation unit (110) for generating a differential output voltage (Vout) between the terminals, a sensor unit (112) configured to measure an electric current (Iout) when flowing through one of the terminals, and a control unit (114) for controlling the signal generation unit, wherein the control unit is configured to control the signal generation unit during a calibration phase to generate a predetermined differential output voltage reference pattern (140), wherein the sensor unit is configured to measure a calibration current unit during the calibration phase, and wherein the control unit is configured to calibrate the signal generation unit depending on the calibration current. The present disclosure also relates to a method for the transceiver.

20 Claims, 8 Drawing Sheets

TRANSCEIVER FOR TRANSMITTING AND RECEIVING SIGNALS AND METHOD FOR THE TRANSCEIVER

CROSS-REFERENCE TO RELATED APPLICATIONS

This application claims the priority under 35 U.S.C. § 119 of European Patent application no. 22305150.9, filed on 10 Feb. 2022, the contents of which are incorporated by reference herein.

TECHNICAL FIELD

The present disclosure relates to a transceiver for transmitting and receiving signals, and a method for the transceiver.

BACKGROUND

Transformer physical layer (TPL) transceiver of the known art can be arranged and construed to be connected to a communication network. For example, the TPL transceiver may be used to interface a microcontroller, such as an micro controller unit (MCU), to a high speed isolated communication network, that includes a first and a second transmission line. In another example, the TPL transceiver may be used in a battery management system (BMS). BMS are often developed to monitor an arrangement of lithium battery cells or the like, which store and output the energy required by various electronic devices, such as of the vehicles. Since the power consumption in the BMS is relevant, a TPL transceiver for the BMS is statically set before its integration, so that the TPL transceiver meets a trade-off between the differential BUS voltage between the communication lines and a power consumption. However, this pre-setting of the TPL transmitter does not take into account the bus characteristics in terms of the actual electrical resistance of the bus line or disturbance occurring in the environment of the bus lines but is usually determined for bus worst case characteristics in order to meet the consumption target. Further, the pre-setting of the TPL transceiver are hardcoded at tests performed prior to the use for of the BMS resulting sometimes in a low robustness of the TPL transceiver over disturbances on communication lines of the communication network.

SUMMARY

Aspects of the disclosure are defined in the accompanying claims.

In accordance with a first aspect of the present disclosure, a transceiver is provided for transmitting and receiving signals, the transceiver comprising: a first and second terminal for coupling to signal lines, a signal generation unit coupled to the terminals and configured to generate a differential output voltage between the terminals, a sensor unit configured to measure an electric current when flowing through one of the terminals, a input interface configured to receive an input signal, and a control unit for controlling the signal generation unit based on the input signal, wherein the control unit is configured to control the signal generation unit during a calibration phase such that the signal generation unit generates a predetermined differential output voltage reference pattern between the terminals, wherein the sensor unit is configured to transmit a sensor signal to the control unit, the sensor signal representing the electrical current referred to as calibration current measured by the sensor unit during the calibration phase, and wherein the control unit is configured to calibrate the signal generation unit depending on the calibration current.

In one or more embodiments, the control unit is configured to compare the calibration current represented by the sensor signal with a reference current stored by the transceiver and to calibrate the signal generation unit based on a result of the comparison, referred to as a comparison result.

In one or more embodiments, the transceiver comprises a memory unit storing reference data representing the reference current.

In one or more embodiments, the signal generation unit comprises an adjustable, electrical internal impedance, wherein the control unit is coupled to the signal generation unit such that the internal electrical impedance is adjustable under control of the control unit, and wherein the control unit is configured to calibrate the signal generation unit by controllably adjusting the internal impedance of the signal generation unit.

In one or more embodiments, the control unit is configured to calibrate the signal generation unit based on the comparison result by controllably adjusting the internal impedance of the signal generation unit.

In one or more embodiments, the signal generation unit comprises an electrical parallel circuit of a plurality of branches connected in parallel, wherein each branch comprises a transistor and an impedance, wherein each branch is configured be enabled or disabled via the associated transistor, wherein the internal impedance of the signal generation unit is formed by the enabled branches of the parallel circuit.

In one or more embodiments, the control unit is coupled to the signal generation unit and configured to control the transistors of the branches of the signal generation unit for adjusting the internal impedance of the signal generation unit.

In one or more embodiments, the control unit is configured to enable or disable the branches of the signal generation unit via the transistors, respectively, for adjusting the internal impedance of the signal generation unit.

In one or more embodiments, the transceiver is configured to perform the following steps:
a) setting the internal electrical impedance of the signal generation unit to a predetermined initial impedance by controllably adjusting the internal impedance at the control unit,
b) generating the differential output voltage reference pattern between the terminals of the transceiver by controlling the signal generation unit at the control unit,
c) measuring by the sensor unit a calibration current flowing through one of the terminals during step b),
d) comparing at the control unit the calibration current from step c) with the reference current,
e) decreasing the internal electrical impedance of the signal generation unit by controllably adjusting the internal electrical impedance at the control unit, if, according to step d), the calibration current is smaller than the reference current, and
f) repeating steps b) to e) until the result of the comparison of step d) indicates that the calibration current is higher than the reference current or that the calibration current is lower than the reference current by less than a predetermined current value.

In one or more embodiments, wherein the differential output voltage reference pattern is formed of a first phase, a second phase, and a third phase that follow each other, and wherein the control unit is configured to control the signal generation unit such that mutually different differential output voltages are generated in the first to third phases, respectively, of which only one differential output voltage is zero.

In one or more embodiments, the control unit is configured to control the signal generation unit such that in the first phase a first predetermined electrical voltage is applied between the terminals, in the second phase a second predetermined electrical voltage, inverse to the first voltage, is applied between the terminals, and in the third phase a zero differential output voltage is applied between the terminals.

In one or more embodiments, a first duration of the first phase and a second duration of the second phase are equal in length, and a third duration of the third phase is twice as long as the first duration.

In accordance with a second aspect of the present disclosure, a method is provided for a transceiver having first and second terminals for coupling to signal lines, a signal generation unit, a control unit, and a sensor unit, the method comprising the steps of:
 a) generating a differential output voltage between the terminals by the signal generation unit,
 b) measuring an electric current flowing through one of the terminals by the sensor unit,
 c) controlling the signal generation unit during a calibration phase by the control unit so that the signal generation unit generates a predetermined differential output voltage reference pattern between the terminals,
 d) transmitting a sensor signal from the sensor unit to the control unit, the sensor signal representing the electrical current measured by the sensor unit during the calibration phase, referred to as the calibration current, and
 e) calibrating, by the control unit, the signal generation unit depending on the calibration current.

In one or more embodiments, the method further comprises the step d1) to be performed before step e), wherein step d1) is as follows: comparing, by the control unit, the calibration current represented by the sensor signal with a reference current stored by the transceiver, wherein the control unit calibrates the signal generation unit in step e) based on a result of the comparison, referred to as a comparison result.

In one or more embodiments, the signal generation unit comprises an adjustable internal electrical impedance, wherein the control unit is coupled to the signal generation unit such that the internal electrical impedance is controllably adjustable by the control unit, and the control unit calibrates the signal generation unit in step e) based on the comparison result by controllably adjusting the internal impedance of the signal generation unit.

DESCRIPTION OF DRAWINGS

Embodiments of the present disclosure will be described in more detail with reference to the appended drawings, in which.

DESCRIPTION OF EMBODIMENTS

In a battery management system (BMS) for an vehicle, electronic systems are developed to monitor an arrangement of lithium battery cells or the like, which store and output the energy required by various electronic devices of the vehicle, also referred to as automotive electronic control units, to operate an electric vehicle, for example, by controlling the charging and discharging functions of the battery cells. The BMS may include one or more battery cell controllers mounted in series, each configured and arranged for controlling several battery cells.

Figure 1:
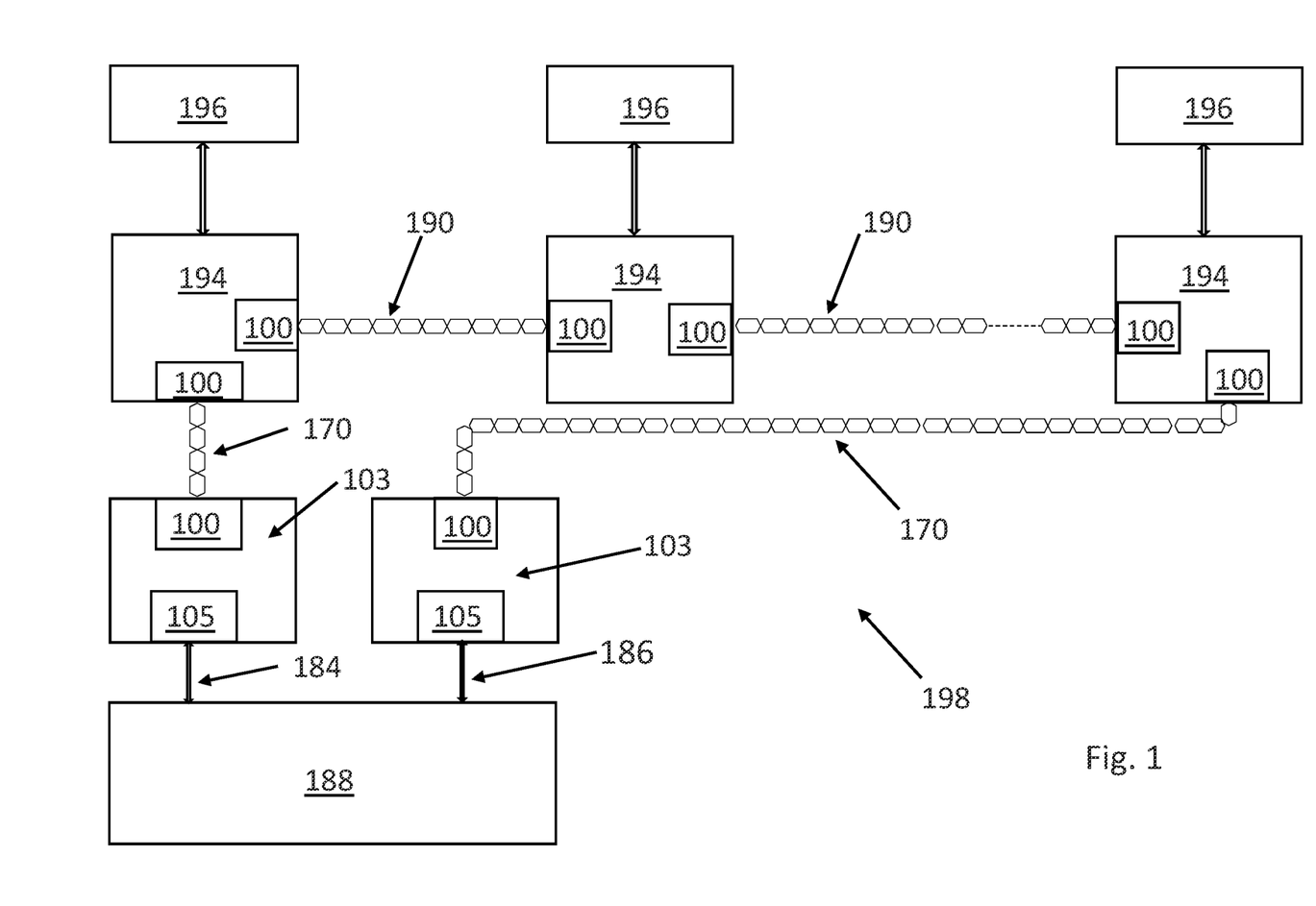
FIG. 1 shows a simplified block diagram of a battery management system.

FIG. 1 schematically illustrates an example of a BMS 198. The battery cell controllers 194 of the BMS 198 are configured to communicate with a micro controller unit (MCU) 188 of the BMS 198. The MCU 188 provides the intelligence to control and monitors a state of the battery cells, for example, a battery health status, and can prevent the attempted operation of defective battery cells.

As shown in FIG. 1, the BMS 198 comprises a plurality of battery cell controller 194 and/or a special purpose hardware processor such as the MCU 188. The MCU 188 is configured for managing and controlling the plurality of battery cell controllers 194. Although three battery cell controllers 194 are shown, a BMS 198 may comprise more than three battery cell controllers 194 configured to communicate with each other serially via transmission lines 190. For example, the battery cell controllers 194 may be connected among each other in a daisy chain configuration. The BMS 198 is not limited to those elements shown in FIG. 1 and may include elements, features, and functions other than those illustrated in FIG. 1.

The BMS 198 may be configured and arranged to perform synchronous battery voltage/current measurement, coulomb counting, cell temperature measurement and integrated cell balancing, validation of the measurement integrity, and/or other functions related to battery monitoring and maximizing the life of the battery, for example, sensing the physical quantities of a lithium-ion battery, monitoring battery functions to validate the integrity of cell measurements, and so on.

Each of the battery cell controllers 194 may be configured to monitor a battery pack 196 comprising a plurality of battery cells, for example, ranging from 6-18 cells but not limited thereto. In doing so, data communications can be established among the battery cell controllers 194 and MCU 188. Galvanically isolated transmission lines 190, or bus, may extend between each of the battery cell controllers 194 to provide a point-to-point differential communication. The battery cell controllers 194 may be co-located in a same module, circuit board and/or housing. Further, at least one of the battery cell controllers 194 and the MCU 188 may be co-located in a same module, circuit board and/or housing.

In example shown in FIG. 1, the BMS 198 may comprise an communication interface unit 103 between the MCU 188 and the first battery cell controller 194 in the daisy chain and in some applications an interface unit 103 between the last battery cell controller 194 of the daisy chain and the MCU 188. Each communication interface unit 103 may comprise on one port a transceiver 105 such as a serial peripheral interface to communicate with the MCU 188 through SPI bus 184/186, some logic to convert bidirectionally the serial peripherical interface message into TPL protocol message and on the second port a TPL transceiver 100 to ensure the TPL communication with a BCC 194 via the galvanically isolated transmission line 170. As a result, the interface unit 103 can connect the MCU 188 to a high speed isolated communication network that includes a galvanically isolated transmission lines 170. The transceiver 100 may be part of a driver circuit of the BMS 198. Further, this transceiver 100 may be configured as a transformer physical layer (TPL) transceiver 100 that is configured and arranged to be a part of an interface unit 103 that interfaces a microcontroller such the MCU 188 to a high speed isolated communication network, or BUS, that includes two transmission lines 170. Furthermore, each BBC 194 may comprise two transceivers 100, namely a transceiver 100 to receive data and another transceiver 100 to send data. It should be noted, however, that the function of each of the transceivers 100 is not explained here.

But in principle, each transceiver 100 is configured to receive an input signal via an input interface of the transceiver 100. The input signal represents data in the form a sequence of bits, wherein each bit may have the logic value of "1" or "0". In case the transceiver 100 receives a bit having a logical level "1", the transceiver 100 may be configured to proceed encoding this bit to generate a differential voltage pattern 140 as, for example, shown in FIG. 2.

Figure 2:
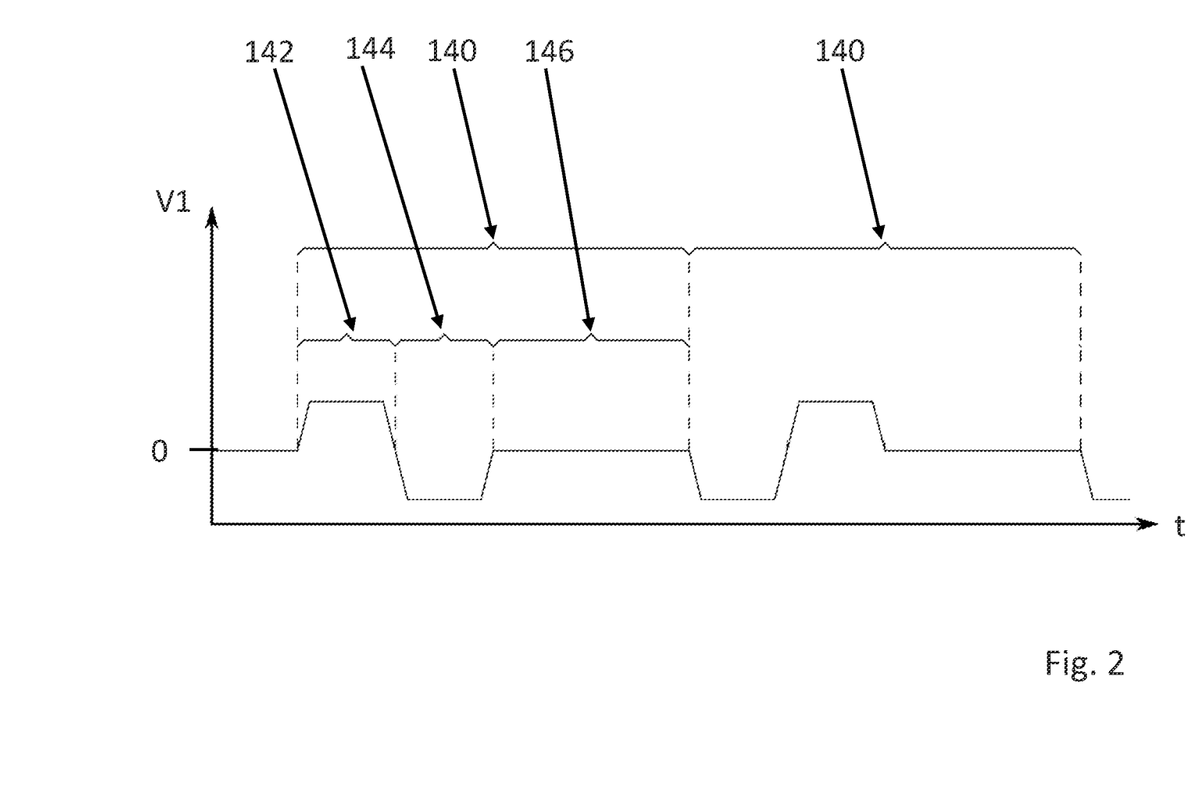
FIG. 2 shows a simplified signal chart of a differential voltage pattern.

For example, the transceiver 100 may be configured to encode a received bit having the logic value "1" as according to the differential voltage pattern 140 follows: in a first phase 142 of the patter 140 a differential positive voltage is generated between the transmission lines 170, then in a subsequent second phase 144 of the pattern 140 a differential negative voltage is generated between the transmission line 170, an then in a subsequent third phase of the pattern 140 no differential voltage, also referred to as zero differential voltage, is generated between the transmission lines 170. The transmission lines 170 may also be referred to as bus line 170. A duration of the first phase 142 and a duration of the second phase 144 may be at least approximately the same. A duration of the third phase 146 may be at least approximately twice the duration of the first or second phase 142, 144. It is noted that the axis for time t is not on the differential voltage 0, but below it.

The transceiver 100 may also be configured to encode a received bit having the logic value "0" according to the differential voltage pattern 141, for example as shown in FIG. 2. Thus, the transceiver 100 of the interface 103 that is connected to the transmission lines 170 may be configured to encode a received bit having the logic value "0" as according to the differential voltage pattern 141 follows: in a first phase of the pattern 141 a differential negative voltage is generated between the transmission lines 170, then in a subsequent second phase of the pattern 141 a differential positive voltage is generated between the transmission line 170, an then in a subsequent third phase of the pattern 141 no differential voltage, also referred to as zero differential voltage, is generated between the transmission lines 170. In principle, the sequence of the pattern 141 can be consider as analog to the pattern 140 but the first and second phases are inverted.

Since the power consumption in the BMS 198 is relevant, a TPL transceiver for the BMS is statically set before its integration, so that the TPL transceiver meets a trade-off between the differential BUS voltage between the communication lines and a power consumption. However, this pre-setting of the TPL transmitter does not take into account the bus characteristics in terms of the actual electrical resistance of the bus line or disturbance occurring in the environment of the bus lines, but is usually determined for bus worst case characteristics in order to meet the consumption target. Further, the pre-setting of the TPL transceiver are hardcoded at tests performed prior to the use for of the BMS resulting sometimes in a low robustness of the TPL transceiver over disturbances on communication lines of the communication network When the BMS 198 is used in a vehicle, electromagnetic interference, which may be referred to as disturbances, acts on the BMS 198. In particular, the disturbances may affect signal lines 170 extending from a transceiver 100 to a battery cell controller 194. In such a case, for example, the disturbances also affect the signal lines 170 during the time while the transceiver 100 is encoding a received bit by generating a corresponding differential voltage pattern 140. In view of an example of a series of signal patterns 140 shown in FIG. 2, the disturbances may interfere with a positive differential voltage between the signal lines 170 in the first phase 142 of the signal pattern 140 or a negative reference voltage between the signal lines 170 in the second phase 144 of the signal pattern 140. To improve the robustness of the data transmission over the signal lines 170, the magnitude of the positive or negative differential voltage for the respective phase 142, 144 could be increased. However, an increased magnitude of the differential voltage results in an increase electrical current flowing through the signal lines 170 during the respective phase 142, 144. Both, the increase magnitude of the differential voltage as well as the increased resulting higher current leads to a higher power consumption for data transmission. In principle, and preferably in the case of a transceiver in a BMS 198, it is desirable that the power consumption of a transceiver 100 be kept as low as possible. At the same time, however, there is also a need for a data transmission caused by the transceiver 100 over the signal lines 170 to be as robust as possible against disturbances.

While data transmission robustness to disturbances may be achieved by increasing the magnitude of the differential voltage in the first and second phases 142, 144, the reduced power consumption of the transceiver 100 may be achieved by decreasing the magnitude of the differential voltage in the first and second phases 142, 144. In the prior art, when manufacturing a transceiver 100, the transceiver 100 was often adjusted such that there is a trade-off between power consumption and robustness to disturbances. The trade-off was often based on statistical and theoretical assumptions that were supposed to represent the average use case. As a result, the adjustment of prior art transceivers 100 is performed during manufacturing and thus, well before the actual use case.

It is to be noted, however, that the trade-off between power consumption and robustness to disturbances achieved in known transceivers 100 does not take into account the actual conditions that exist when transceivers 100 are actually used in real environment. For example, if a transceiver 100 is used in an environment where an impedance of signal lines 170 and an impedance of a receiver, in particular of a battery cell controller 194, are each smaller than the theoretical impedances assumed at the adjustment of the transceiver 100 during its manufacturing, the transceiver 100 may ensure low power consumption but will not achieve the necessary robustness to disturbances. Therefore, there is a need for a transceiver 100 that also achieves the desired trade-off between power consumption and robustness to disturbances when in use, where disturbances affect the transceiver 100, the signal lines 170 and/or the receiver. This need may exist for a transceiver 100 used for a BMS 198 as well as for a transceiver 100 used in another technical environment.

Figure 3:
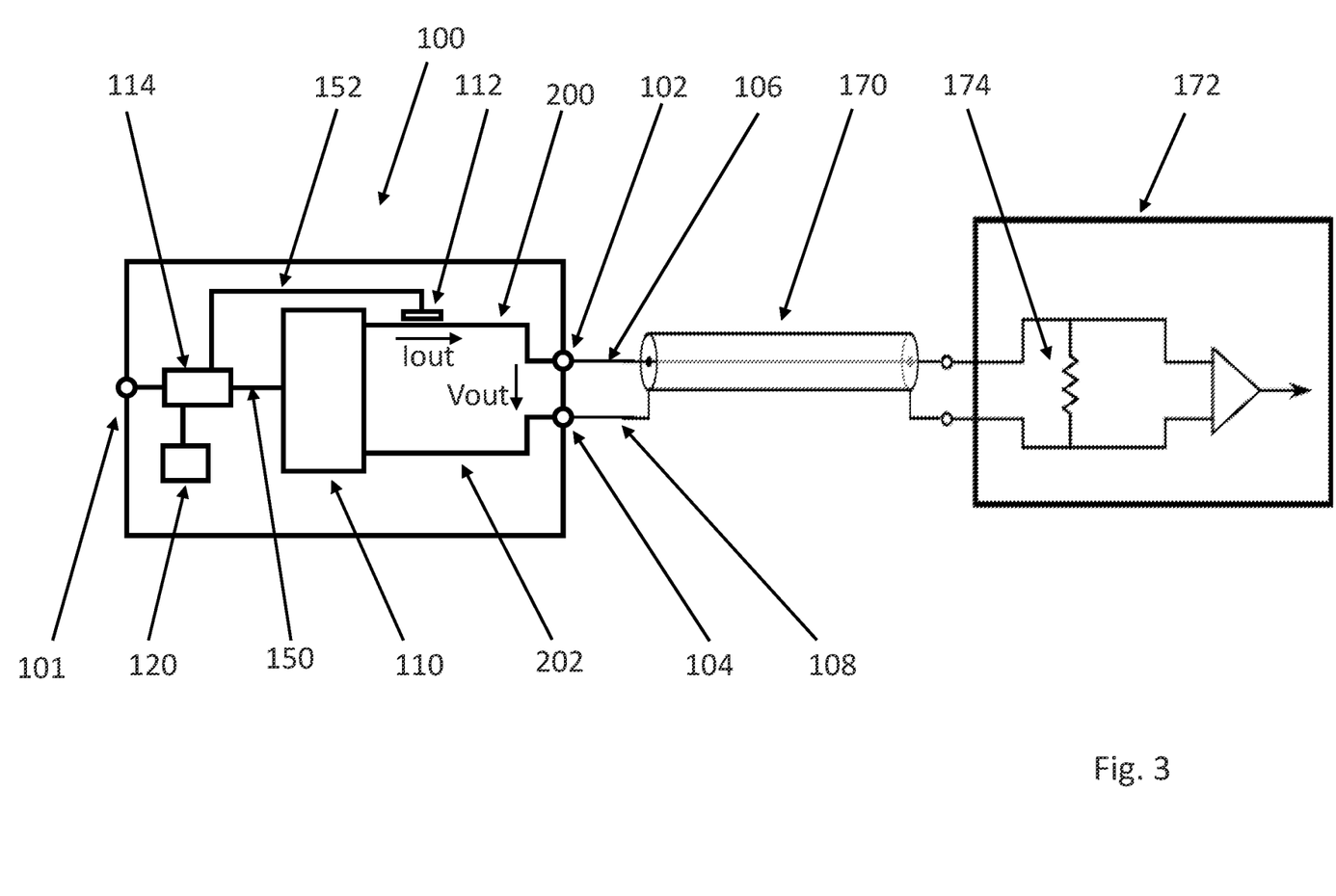
FIG. 3 shows a simplified block diagram of a network including an embodiment of the transceiver.

FIG. 3 schematically illustrates an example of a transceiver 100 according to an aspect of the present disclosure. The transceiver 100 is coupled to a receiver 172 via signal lines 170. The signal lines 170 and the receiver 172 are also shown schematically in FIG. 3.

The transceiver 100 is preferably designed for transmitting and receiving signals representing data. The transceiver includes a first terminal 102 and a second terminal 104 configured to couple to signal lines 170. Further, the transceiver 100 includes a signal generation unit 110 coupled to the terminals 102, 104 and configured to generate a differential output voltage Vout between the terminals 102, 104. Additionally, the transceiver 100 includes a sensor unit 112 configured to measure a current Iout as it flows through one of the terminals 102, 104. An input interface 101 of the transceiver 100 is configured to receive an input signal. The input signal is preferably a digital input signal. Further, the transceiver 100 comprises a control unit 114 for controlling the signal generation unit 110 based on the input signal. The control unit 114 is configured to control the signal generation unit 110 during a calibration phase such that the signal generation unit 110 generates a predetermined differential output voltage reference pattern between the terminals 102, 104. The sensor unit 112 is configured to transmit a sensor signal to the control unit 114, the sensor signal representing the electrical current Iout, referred to as the calibration current, measured by the sensor unit 112 during the calibration phase. Further, the control unit 114 is configured to calibrate the signal generation unit 110 based on the measured calibration current.

The transceiver 100 enables the advantage of a well-balanced compromise between power consumption and robustness to disturbances adapted to the actual use of the transmitter in an real environment.

During a calibration phase, the signal generation unit 110 is controlled by the control unit 114 of the transceiver 100 such that a predetermined differential output voltage reference pattern is generated between the terminals 102, 104. For example, the output voltage reference pattern may correspond to the pattern 140 of FIG. 2. If the signal lines 170 are coupled to the terminals 102, 104 during the use of the transceiver 100 in a real environment such that a receiver 172 is connected to the transceiver 100 via the signal lines 170, a current Iout is caused during the calibration phase based on the output voltage reference pattern. This current Iout is measured by the sensor unit 112 of the transceiver 100. The current Iout flows through an internal impedance of the signal generation unit 110 as well as through the signal lines 170 and an impedance 174 of the receiver 172. If the current Iout is small, disturbances acting on the signal lines 170 and the receiver 172 may cause data transmission errors. A higher current Iout can prevent or at least mitigate the data transmission errors, but at the same time a higher current Iout results in a correspondingly higher power consumption due to the impedance of the signal lines 170 and the impedance 174 of the receiver 172.

The electric current Iout actually created during the calibration phase is measured as calibration current by the sensor unit 112. The calibration current is preferably the electrical current Iout averaged over the calibration time of the calibration phase. However, it is also possible that the calibration current is understood to be the absolute maximum electric current of the electric current Iout created during the calibration phase. Other suitable rules for determining the calibration current from the electric current Iout created during the calibration phase are also possible and my apply.

Based on the calibration current, the signal generation unit 110 is calibrated by the control unit 114 of the transceiver 100. In this regard, the calibration may be performed through the control unit 114 such that the current Iout occurring after calibration during use of the transceiver the same real environment for transmitting data via the signal lines 170 to the receiver 172 provides a sufficiently high robustness to disturbances while keeping the electrical power consumption by the signal lines 170 and the receiver 172 as small as possible. For example, it is possible that the transceiver 100 is calibrated such that, if the calibration would theoretically be performed again after said calibration, the calibration current during this further calibration phase is within a predetermined current range, preferably determined by a predetermined lower current limit and a predetermined upper current limit. The calibration of the signal generation unit 110 of the transceiver 100 may be performed through the control unit 114 by changing an electrical characteristic of at least one component of the signal generation unit 110. The electrical characteristic of at least one component of the signal generation unit 110 may be accessible for the control unit 114. Thus, the electrical characteristic may be controllable by the control unit 114.

In contrast to known transceivers, the presented transceiver 100 is not fixed to pre-set electrical characteristics of the signal generation unit 110, wherein pre-set characteristics of a signal generation are set during manufacturing of known signal generation units 110, such that known signal generation units 110 often do not achieve the desired compromise in real use environments, but only in the rare case, if the theoretical assumptions leading to the pre-set characteristics of the known transceivers are met in real use.

The sensor unit 112 and control unit 114 of the transceiver 100 according to an aspect of the present disclosure overcome the drawback as discussed above. In fact, the control unit 114 of presented transceiver 100 enables the signal generation unit 110 to be adapted to the actual electrical conditions in use of the real environment by a calibration performed while the transceiver is connected to desired network and/or other components. Advantageously, the use of the calibration current measured by the sensor unit 112 of the transceiver 100 has been found a reliable basis for the calibration. It follows that the transceiver 100 according to according to an aspect of the present disclosure ensures an improved compromise between power consumption and robustness to disturbances.

As can be seen from an example of the transceiver 100 as schematically shown in FIG. 3, a first internal signal line 200 extends from the signal generation unit 110 to the first terminal 102. A second internal signal line 202 extends from the signal generation unit 110 to the second terminal 104. As a result, the signal generation unit is configured and arranged to generated a pattern 140 of differential voltages at different phases 142, 144, 146 between the two terminals 102, 104 via the two internal signal lines 200, 202. If the receiver 172 is connected to the first and second terminals 102, 104 of the transceiver 100 via the signal lines 106, 108 and a differential output voltage Vout is generated by the transceiver 100 between the two terminals 102, 104, a current Iout flows through the first internal signal lines 200. The same current Iout also flows through the first terminal 102, the first signal lines 106, the impedance 174 of the receiver 172, the second signal line 108, the second terminal 104 and the second internal signal lines 202.

The sensor unit 112 is preferably arranged and configured to measure the current Iout through the first internal signal lines 200 or through the second internal signal lines 202. In principle, the current Iout can also be measured at another location within the transceiver 100 by the sensor unit 112. By measuring the current Iout flowing through one of the two internal signal lines 202, the same current Iout flowing through one of the two terminals 102, 104 is thereby also measured. Thus, the measurement of the current Iout through one of the two terminals by the sensor unit 112 can be an indirect measurement of the current Iout.

The input interface 101 is configured to receive the input signal. The input signal is preferably a digital signal. The input interface 101 is preferably connected to the control unit 114 of the transceiver 100 via another signal connection. The control unit 114 of the transceiver 100 may be configured to control the signal generation unit 110 based on the received input signal. For example, the control unit 114 may control the signal generation unit 110 such that differential output voltage patterns are generated by the signal generation unit 110 between the terminals 102, 104 representing the bits of the digital input signal.

The control unit 114 is preferably configured to change from a calibration mode to a working mode, or vice versa. The control unit 114 may be configured to automatically change to the calibration mode with switching on the transceiver, in particular if an operating voltage is first supplied to the transceiver 100. In an example, it may be provided that the control unit 114 is configured to change to the calibration mode by a command. This command may be transmitted to the control unit 114 via the input signal. If data arrives at the control unit 114 via the input signal, the data representing the command to change the control unit 114 to the calibration mode, the control unit 114 may change to and/or execute the calibration mode. Preferably, the calibration phase is the time while the control unit 114 is in the calibration mode. The control unit 114 may be configured to automatically change from the calibration mode to the working mode once the control unit 114 has completed calibrating the signal generation unit 110. Preferably, the working phase is the time while the control unit 114 is in the working mode. Further, the calibration may not be performed by the control unit 114 during the working mode, but only while being in the calibration mode. Thus, the calibration phase may be automatically followed by the working phase. In the working mode, the control unit 114 is preferably configured to control the signal generation unit 110 such that data for transmission (use data) received by means of the input signal is converted into corresponding differential output voltage patterns. Therefore, in the working mode or in working phase, the transceiver 100 may operate in principle like a conventional transceiver 100. During the working mode or working phase, the previously performed calibration of the signal generation unit 110 is maintained so that the improved trade-off between power consumption and robustness against disturbances is ensured in the working mode or during the working phase.

In another example, the control unit 114 may be configured to update the calibration of the signal generation unit 110. To achieve the update, the control unit 114 may be re-entered into the calibration phase via the previously explained command to re-execute the calibration of the signal generation unit 110. Subsequently, the change to the working mode or working phase may be performed again. Updating the calibration of the signal generation unit 110 offers the advantage that the transceiver 100 can also be adapted to possibly changing environmental conditions, in particular with respect to the receiver 172 and/or the signal lines 170, so that the advantageous compromise between power consumption and robustness to disturbances can also be achieved again after a change in the environmental conditions.

In another example of the transceiver 100, the control unit 114 is configured to compare the calibration current Iout represented by the sensor signal from the sensor unit 112 with a reference current stored by the transceiver 100 and the control unit 114 may also be configured to calibrate the signal generation unit 110 based on a result of the comparison, referred to as the comparison result. The reference current is preferably represented by a value stored by the transceiver 100. The reference current may be predetermined reference current such that if a calibration current corresponds to the reference current, it is achieved that the advantageous trade-off between the power consumption and robustness to disturbances is provided. For example, the reference current may be predetermined such that a sufficiently large voltage is dropped across the impedance 174 of a receiver 172 when the reference current flows through the impedance 174. At the same time, the reference current may be predetermined such that the power consumption is as small as possible to still achieve the aforementioned voltage drop. The comparison result that can be determined by the control unit 114 may be, for example, the difference between the calibration current and the reference current. In another example, the comparison result may be determined by the control unit 114 to be a difference value representing the difference between the two currents. The difference value may also be referred to as an error current. Preferably, the control unit 114 is configured to calibrate the signal generation unit 110 based on the comparison result. For example, if the comparison result represents a large difference between the calibration current and the reference current, the control unit 114 will change adjustable parameters of the signal generation unit 110 so that when the differential output voltage reference pattern is or would be generated again at the output terminal 102, 104, a current Iout is measured by the sensor unit 112 as the calibration current that is equal to the reference current or deviates from the reference current by less than a predetermined threshold value. The predetermined threshold value can be selected sufficiently small so that, in simplified terms, it can be said that the calibration current corresponds approximately to the reference current. For example, the threshold value can predefined to a maximum of 10% of the reference current. The changes of the parameters of the signal generation unit 110 are retained at the end of the calibration phase, so that the signal generation unit 110 is calibrated for the subsequent working phase.

In another example, the transceiver 100 includes a memory unit 120, which is configured to store reference data representing the reference current. The control unit 114 of the transceiver 100 may be configured to access the reference data stored in the memory unit 120. The reference data may be accessed by the control unit 114 to perform the previously explained comparison between the calibration current and the reference current. It is to be noted that the calibration current may be digitized by the sensor unit 112 or the control unit 114 to perform the comparison with the reference data. In this regard, the data-based comparison may correspond to the comparison of the two electrical currents.

Figure 4:
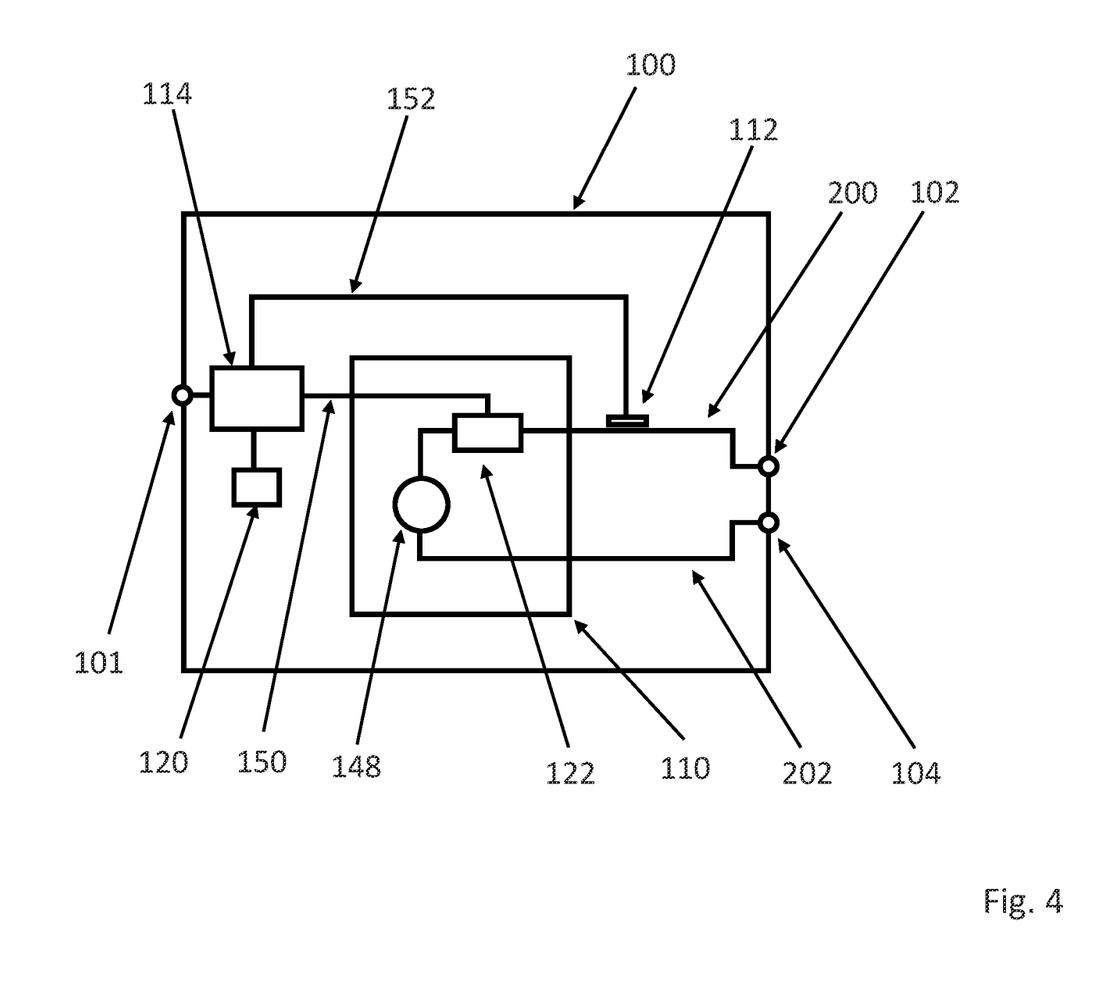
FIG. 4 shows a simplified block diagram of another embodiment of the transceiver.

FIG. 4 schematically illustrates another example of the transceiver 100 according to the present disclosure. The signal generation unit 110 of the transceiver 100 may include an adjustable, electrical internal impedance 122. The electrical internal impedance 122 may be understood to be an electrical component or unit. Further, the control unit 114 is preferably coupled to the signal generation unit 110 such that the electrical internal impedance 122 is adjustable by the control unit 114. For example, control signals may be directed from the control unit 114 to the signal generation unit 110, and preferably to the adjustable electrical internal impedance 122, such that the impedance value of the electrical internal impedance 122 is changed by and/or in accordance to the control signals. To direct the control signals from the control unit 114 to the electrical internal impedance 122, a control line 150 may be provided extending from the control unit 114 to the signal generation unit 110, and preferably within the signal generation unit 110 to the electrical internal impedance 122. The impedance value of the electrical internal impedance 122 can thus be adjusted directly by the control unit 114.

Preferably, the control unit 114 is configured such that the control unit 114 calibrates the signal generation unit 110 by controlled adjustment of the internal electrical impedance 122. The calibration current generated during the calibration phase also depends on the impedance value of the electrical internal impedance 122. If the impedance value is decreased in a controlled manner of the electrical internal impedance 122 by the control unit 114, the calibration current increases. The reverse is also valid. It follows that the control unit 114 is configured and arranged to calibrate the electrical internal impedance 122 by changing its impedance value in such a way that the calibration current corresponds to the reference current. Reference is made to the preceding explanations concerning the calibration of the calibration current in an analogous manner. Thus, according to another example of the transceiver 100, it is provided that the control unit 114 is configured to calibrate the signal generation unit 110 based on the comparison result by controllably adjusting the internal impedance 122 of the signal generation unit 110 through the control unit 114. As a result, the change in the impedance value of the electrical internal impedance 122 may be performed by the control unit 114 in such a manner during calibration as to ensure the advantageous trade-off between power consumption and robustness to disturbances.

Figure 5:
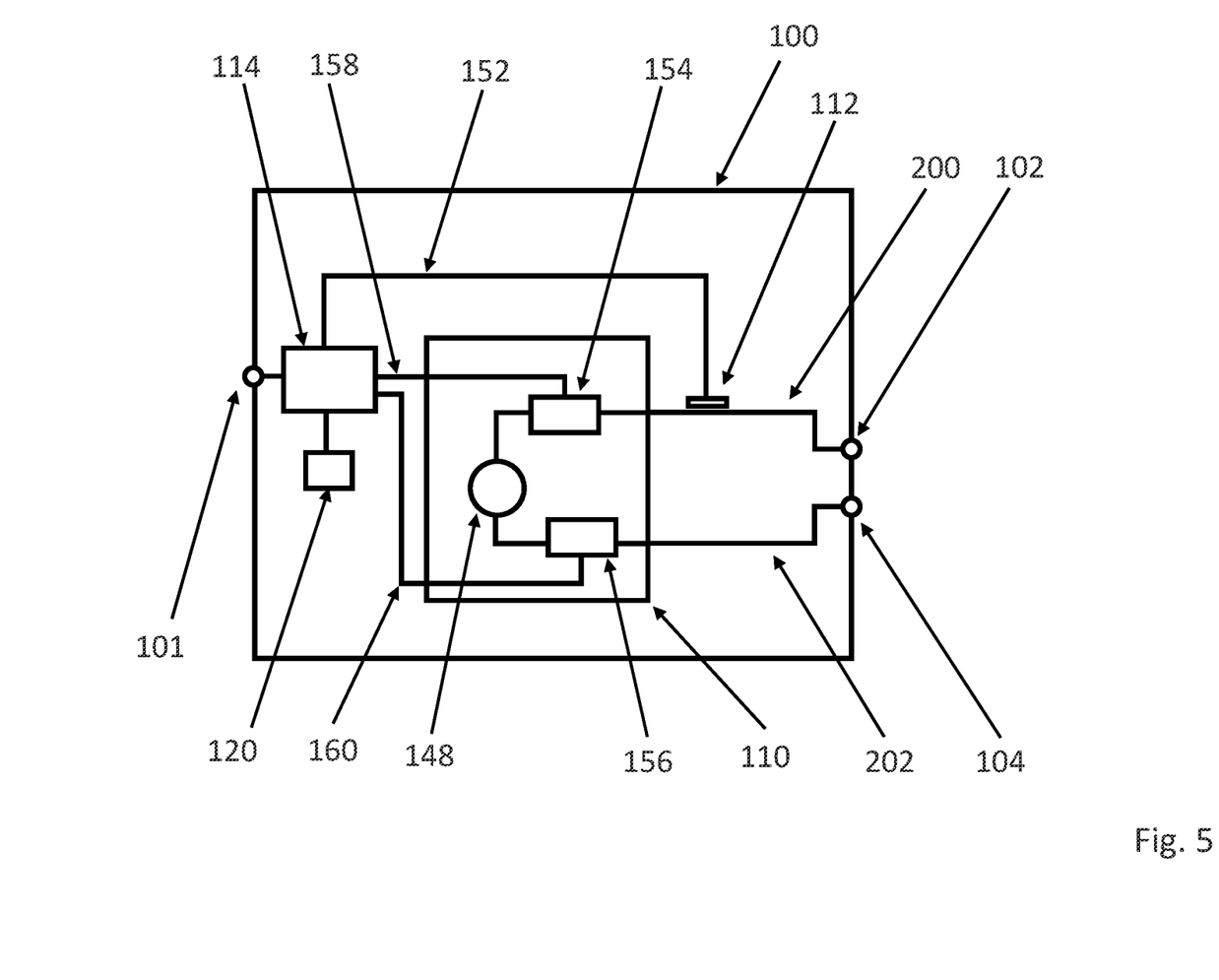
FIG. 5 shows a simplified block diagram of another embodiment of the transceiver.

Another example of the transceiver 100 is shown schematically in FIG. 5. The transceiver 100 of FIG. 5 corresponds at least substantially to the transceiver 100 of FIG. 4, so that for the transceiver 100 of FIG. 5 reference is made to the previous explanations in an analogous manner. In FIG. 5, the electrical internal impedance 122 of the signal generation unit 110 is formed by a plurality of parts. In an example, the electrical internal impedance 122 may be formed by a first part 154 of the electrical internal impedance 122 and a second part 156 of the electrical internal impedance 122. The control line 150 shown in FIG. 4 may be replaced by two control lines 158, 160 in the embodiment of the transceiver 100 shown in FIG. 5. The first control line 158 extends from the control unit 114 to the first part 154 of the electrical internal impedance 122 and the second control line 160 extends from the control unit 114 to the second part 156 of the electrical internal impedance 122. The control unit 114 may be configured to separately control the plurality of parts 154, 156 of the electrical internal impedance 122.

By separately controlling the plurality of parts 154, 156, the control unit 114 can adjust the resulting impedance value of the electrical internal impedance 122.

Figure 6:
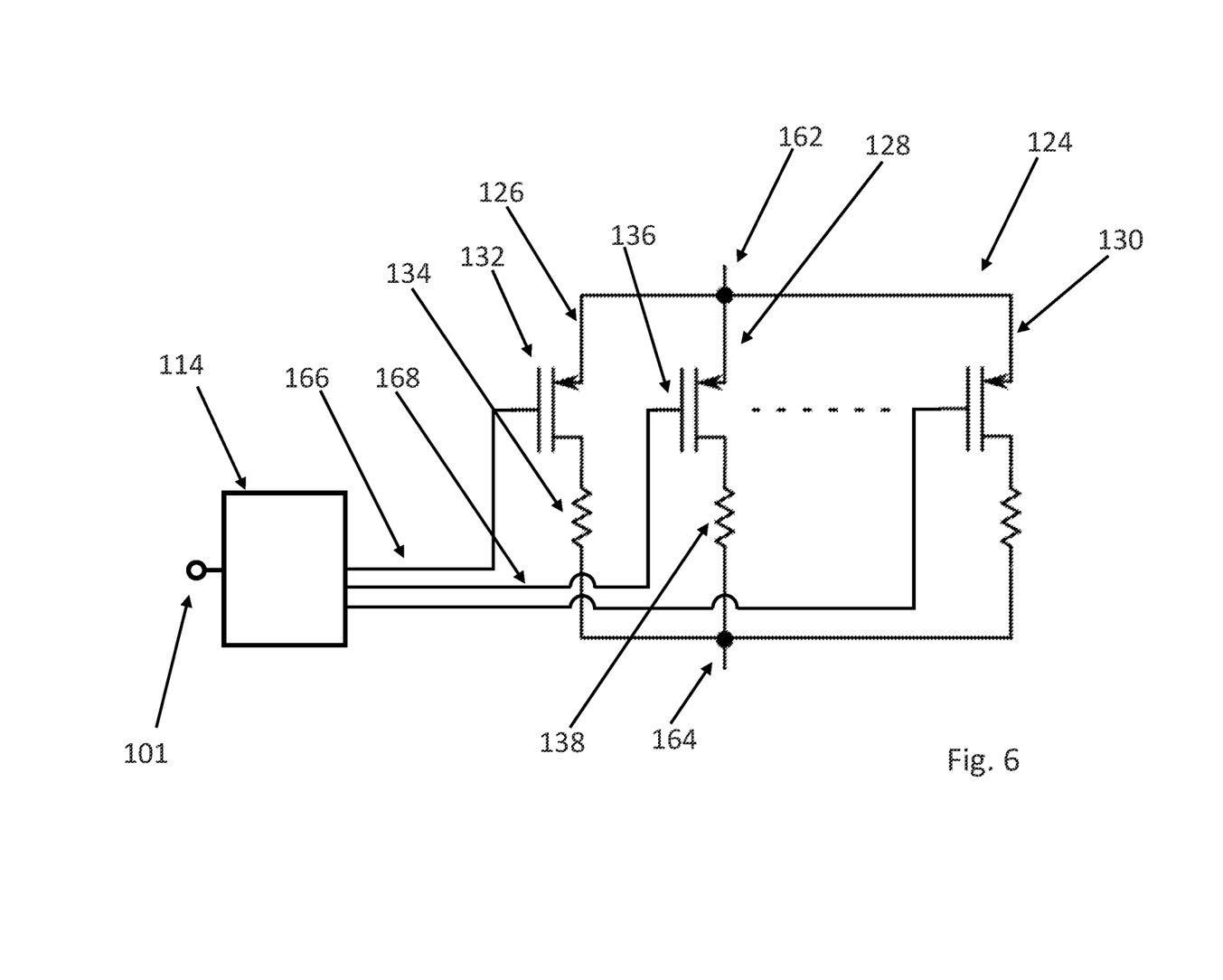
FIG. 6 shows a simplified block diagram of a control unit and a parallel circuit.

FIG. 6 illustrates an example of an electrical parallel circuit 124, wherein the parallel circuit 124 is coupled to the control unit 114. The parallel circuit 124 may represent another example of the electrical internal impedance 122 of the signal generation unit 110. It is noted that not all parts of the signal generation unit 110 are shown in FIG. 6, but a simplification has been made to explain the example of the electrical internal impedance 122. In this example of the transceiver 100, the signal generation unit 110 includes the electrical parallel circuit 124, which comprises a plurality of branches 126, 128, 130 connected in parallel. Each branch 126, 128, 130 includes a transistor 132, 136 and an impedance 134, 138. Further, each branch 126, 128, 130 is configured to be activated or deactivated via the associated transistor 132, 136. The electrical internal impedance 122 of the signal generation unit 110 is formed exclusively by the activated branches 126, 128, 130 of the parallel circuit 124. Thus, the impedance value of the electrical internal impedance 122 can be adjusted in a controlled manner by activating or deactivating individual or multiple branches 126, 128, 130 through the control unit 114. In other words, the impedance value of the electrical internal impedance 122 is defined only solely by the impedances 134, 138 of the activated branches 126, 128, 130. The deactivated branches do not have current flowing through them and therefore do not contribute to the impedance value of the electrical internal impedance 122.

In an example of the transceiver 100, the control unit 114 is coupled to the signal generation unit 110 and configured such that the control unit 114 controls the transistors 132, 136 of the branches 126, 128, 130 of the signal generation unit 110 to adjust the internal impedance 122 of the signal generation unit.

Each of the transistors 132, 136 of the parallel-connected branches 126, 128, 130 may be connected individually to the control unit 114 via a respective associated control line 166, 168. For example, the control unit 114 may be configured to enable or disable the first branch 126 via the associated, first transistor 132. The first transistor 132 is preferably coupled to the control unit 114 via the control line 166, such that the first transistor 132 may be set in an open switching state or a closed switching state by a control signal from the control unit 114. The control signal from the control unit 114 is received by the first transistor 132 via the control line 166. The first branch 126 is activated when the first transistor 132 is closed (in the closed switching state). Conversely, the first branch is deactivated when the first transistor 132 is open (in the open switching state). The previous explanations may apply in an analogous manner to the other branches 128, 130 of the parallel circuit 124. In an example, this is explained with reference to the second branch 128. The control unit 114 may be configured to enable or disable the second branch 128 via the associated, second transistor 136. The second transistor 136 is preferably coupled to the control unit 114 via the control line 168, such that the second transistor 136 can be set to an open switching state or a closed switching state by a control signal from the control unit 114. The control signal from the control unit 114 is received by the second transistor 136 via the control line 168. The second branch 128 is activated when the second transistor 136 is closed (in the closed switching state). Conversely, the second branch 128 is disabled when the second transistor 136 is open (in the open switching state).

In an example, control unit 114 of transceiver 100 may be configured such that control unit 114 activates or deactivates branches 126, 128, 130 of signal generation unit 110 via transistors 132, 136 to adjust internal impedance 122 of signal generation unit 110.

In an example, each branch 126, 128, 130 may be constructed differently. However, it is preferred that each of the branches 126, 128, 130 is formed identically, in particular with identical electrical components. Each impedance 134, 138 of a branch 126, 128, 130 may be formed by, or at least substantially characterized by, an electrical ohmic resistance. However, it is also possible that each impedance 134, 138 of a branch 126, 128, 130 may be formed solely by the transistor 132, 136 of the respective branch 126, 128, 130 or is at least substantially formed by the respective transistor 132, 136. In this case, the ohmic resistor in the respective branch 126, 128, 130 can be omitted. In other words, the impedance of a branch 126, 128, 130 must not necessarily be formed by a separate component. The electrical current flowing through a branch during the calibration phase may be controlled by limiting a current through the respective associated transistor 132, 136 of the branch 126, 128, 130. The transistor 132, 136 of a branch 126, 128, 130 may be a bipolar transistor, wherein the current through the bipolar transistor may be controlled through the control unit 114 by controlling the base current of the respective transistor 132, 136. In another example, the transistor 132, 136 of a branch 126, 128, 130 may be a MOSFET transistor, wherein the current through the respective branch 126, 128, 130 may be controlled through the control unit 114 by driving a gate-source voltage of the MOSFET transistor.

As a result, an adjustment of the calibration current can be made by means of the control unit 114 by an appropriately adjusted number of activated branches 126, 128, 130. This results in an adjustment of the impedance value of the electrical internal impedance 122. Provided that bipolar transistors are used in the branches 126, 128, 130 to generate the respective associated impedance, a limitation of the respective branch current can be understood as an analogous adjustment of the branch impedance. Provided that a MOSFET transistor 132, 136 is used in a respective branch 126, 128, 130, the respective branch impedance may be determined by the switching state of the respective MOSFET transistor.

Figure 7:
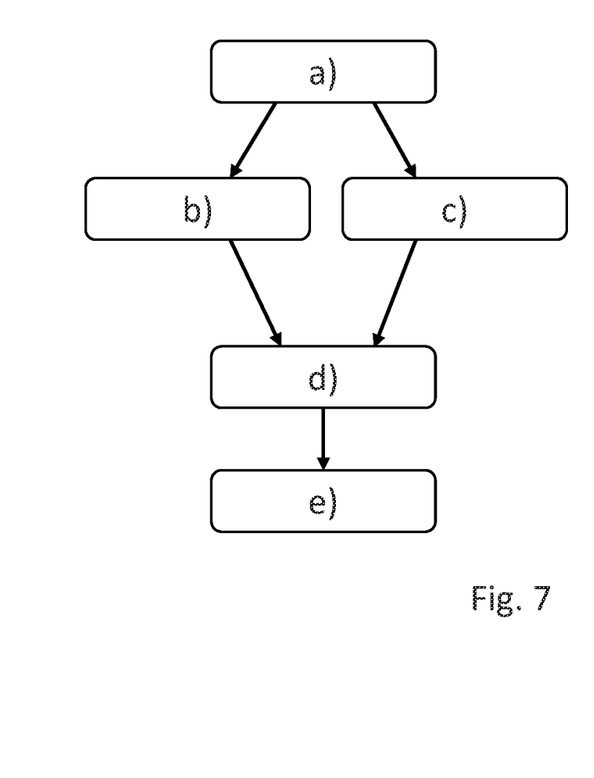
FIG. 7 shows a simplified flow chart of an embodiment of the method.

In another example, the transceiver 100 is configured to perform the following steps a) through e), wherein FIG. 7 shows a schematic flow chart for steps a) to e):

Step a): setting the electrical internal impedance 122 of the signal generation unit 110 to a predetermined initial impedance by controlled adjustment of the internal impedance by the control unit 114;

Step b): generating the differential output voltage reference pattern between the terminals 102, 104 of the transceiver 100 by controlling the signal generation unit 110 by the control unit 114;

Step c): measuring a calibration current Iout with the sensor unit 112 flowing through one of the terminals 102, 104 during step b);

Step d): comparing of the calibration current Iout from step c) with the reference current by the control unit 114; and Step e): decreasing (preferably reducing the impedance value of) the electrical internal impedance 122 of the signal generation unit 110 by controllably adjusting of the electrical internal impedance by the control unit 114, if according to step d) the calibration current Iout is smaller than the reference current.

Further, the transceiver 100 is preferably configured to repeat steps b) to e) until the result of the comparison of step d) indicates that the calibration current Iout is greater than the reference current or that the calibration current Iout is less than the reference current Iref by less than a predetermined threshold current value.

From the flow chart of FIG. 7, it can be seen that steps a), b), d) and e) are preferably executed one after the other. It is to be noted, however, that step c) is executed in parallel to step b). It should also be noted that step a) is executed before step b). Moreover, step d) is executed after the execution of step b). Step e) is executed after step d).

Figure 8:
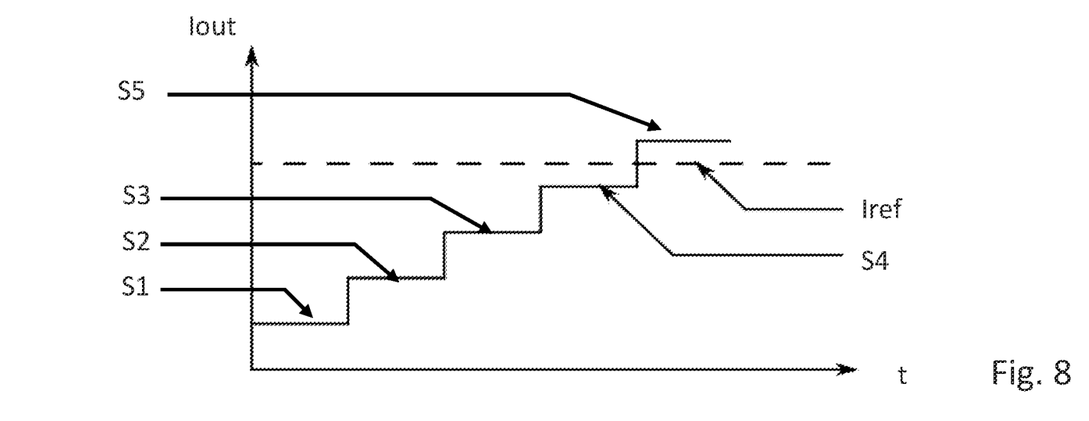
FIG. 8 shows a simplified stage chart.

For further explanation of steps a) to e), reference is also made to FIG. 8, from which the stepwise increase of the calibration current IC with each repetition of the group of steps b) to e) can be seen schematically.

With the initial execution of step a) by the control unit 114, the impedance value of the internal electrical impedance 122 of the signal generation unit 110 is set to the predetermined initial value, also referred to as the initial impedance. With reference to the example of FIG. 6, for example, the control unit 114 may initially activate only one of the branches 126 and deactivate the remaining branches 128, 130. This adjustment of the parallel circuit 124 may cause the internal impedance 122 to have a large impedance value. This impedance value may correspond and/or be a predetermined initial value of the electrical internal impedance 122.

With the execution of step b) by the signal generation unit 110 controlled by the control unit 114, the differential output voltage reference pattern is generated. This output voltage reference pattern may correspond, for example, to pattern 140 of FIG. 2. The output voltage Vout is generated between terminals 102, 104 according to pattern 140. The shape of output voltage reference pattern generated by the signal generation unit 110 may be controlled by the control unit 114, in particular according to the bits of the input signal received via the input interface 101.

As has been previously explained, calibration of the signal generation unit 110 of the transceiver 100 is of particular advantage in the context of use of the transceiver 100 in an real environment in order to adapt to real environmental conditions. Thus, if step b) is carried out during use at the real environment in which the transceiver 100 is connected to a receiver 172 via signal lines 170, as shown schematically in FIG. 3, for example, an electric current Iout, referred to as the calibration current, will flow through each of the two terminals 102, 104. In addition, as is shown schematically in FIG. 3, for example, this current flows through internal signal lines 200, 202 of the transceiver 100. It has been found to be practical if the sensor unit 112 is arranged in connection with at least one of these two internal signal lines 200, 202 to measure the calibration current Iout.

During step b), during which step c) is executed at least partly in parallel, the calibration current Iout flowing through one of the two terminals 102, 104 is measured by the sensor unit 112. The calibration current Iout can be measured indirectly, for example by measuring the calibration current Iout flowing through one of the two internal signal lines 200, 202.

The sensor unit 112 may be configured to generate a sensor signal representing the measured calibration current Iout. The sensor unit 112 may be coupled to the control unit 115 via a sensor line 152, so that the sensor signal is transmitted from the sensor unit 112 to the control unit 114 via the sensor line 152. The sensor signal provides the control unit 114 with a current value representing the calibration current Iout.

in step c), the control unit 114 performs a comparison of the calibration current Iout with the reference current Iref.

FIG. 8 shows an example representing several stages S1 to S5, which may correspond to the number of repetitions of steps b) to e).

Figure 9:
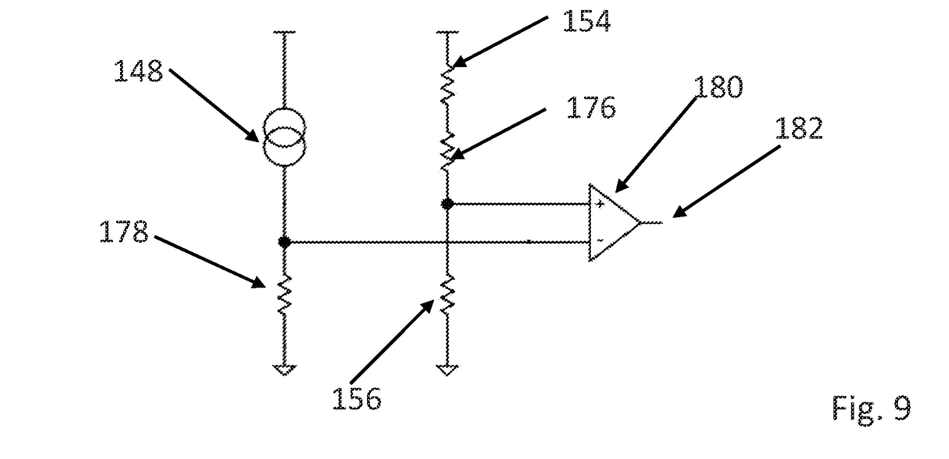
FIG. 9 shows a simplified block diagram of a circuit for the control unit.

Stage S1 of FIG. 8 represents the case in which steps b) to e) are executed for the first time. In stage S1, the control unit 114 determines that the calibration current Iout measured by the sensor unit 112 is smaller than the reference current Iref. The comparison of the calibration current Iout with the reference current Iref can be performed in digital form by of the control unit 114 if the two currents have been digitized before. However, it may also be possible for the control unit 114 to have circuitry that is embodied in an example in FIG. 9, which schematically illustrates an example circuit for performing step c), wherein the circuit may form part of the control unit 114. The circuit shown in FIG. 9 includes a current source 148, a reference impedance 178, and a comparator 180. The current source 148 and the reference impedance 178 are connected in series, with a node between the current source 148 and the reference impedance 178 connected to a first of the two inputs of the comparator 180. The current source 148 is configured to provide the reference current Iref. FIG. 9 shows another series connection of the first part 154 of the electrical internal impedance 122, another impedance 176 representing the total impedance of the load, i.e., the impedance of the signal lines 170 and the impedance 174 of the receiver 172, and the second part 156 of the electrical internal impedance 122. During the calibration phase, the calibration current runs through this series connection. A node between the second part 156 and the impedance 176 is coupled to a second input of the comparator 180. The electrical voltage at the second input of the comparator 180 represents the reference current Iref, and the electrical voltage at the first input of the comparator 180 represents the calibration current Iout. Thus, the signal at the output 182 of the comparator represents the result of the comparison whether the calibration current Iout is less than the reference current Iref.

Preferably, the control unit 114 is configured to perform step e). In step e), the control unit 114 controls the electrical internal impedance 122 of the signal generation unit 110 so that the impedance value of the electrical internal impedance 122 becomes smaller. As a result, the calibration current Iout is increased when steps b) and c) are executed in the next stage (for instance stage S2).

Each of the stages S1, S2, S3, S4, S5 include the steps b) to e). The number of stages is not fixed at five. Rather, a different number of repetitions can also be performed. The number of repetitions depends on how often the repetition must take place until the calibration current Iout in the last executed step d) is either greater than the reference current Iref or is still less than the reference current Iref but deviates from the reference current Iref by less than the predetermined threshold current (value).

For example, FIG. 8 schematically illustrates the case in which, at stage S5 in step d), it is determined by the control unit 114 that the calibration current Iout is (for the first time) greater than the reference current Iref. As a result, the stage S5 represents the last stage and also the last repletion of the steps b) to e). As a further result, the impedance value of the electrical internal impedance 122 set by means of the control unit 114 during stage S5 and/or its associated step e) is suitable to ensure an advantageous compromise between power consumption and robustness to disturbances.

The control unit 114 is preferably configured to control the signal generation unit in step b) such that output voltage reference pattern is generated by the signal generation unit 110, such as schematically illustrated for example by the pattern 140 in FIG. 2. In this example, the output voltage reference pattern 140 comprises the first phase 142, the second phase 144 and the third phase 146, which follow one another. Furthermore, the control unit 114 is preferably configured to control the signal generation unit 110, such that mutually different differential output voltages are generated in each of the first to third phases 142, 144, 146, of which only one differential output voltage 146 is zero.

In another example, the control unit 114 is configured to control the signal generation unit 110 such that in the first phase 142, a first predetermined electrical voltage is applied between the terminals 102, 104, in the second phase 144, a second predetermined electrical voltage that is inverse to the first voltage is applied between the terminals 102, 104, and in the third phase 146, a output voltage of zero (zero difference output voltage) is applied between the terminals 102, 104.

Preferably, a first duration of the first phase 142 and a second duration of the second phase 144 are equal, wherein a third duration of the third phase 146 being twice as long as the first duration.

An embodiment of the method according to an aspect of the present disclosure is shown schematically in the flow chart of FIG. 7. The method relates to the transceiver 100 comprising first and second terminals 102, 104 for coupling to signal lines 170, the signal generation unit 110, the control unit 114, and the sensor unit 112. The method comprising the steps a) to e):

Step a): generating a differential output voltage between the terminals 102, 104 by the signal generation unit 110;

Step b): measuring an electric current Iout flowing through one of the terminals 102, 104 by the sensor unit 112;

Step c): controlling the signal generation unit 110 during a calibration phase by the control unit 114 so that the signal generation unit 110 generates a predetermined differential output voltage reference pattern 140 between the terminals 102, 104;

Step d): transmitting a sensor signal from the sensor unit 112 to the control unit 114, the sensor signal representing the electrical current Iout measured by the sensor unit 112 during the calibration phase, referred to as the calibration current; and Step e): calibrating, by the control unit 114, the signal generation unit 110 depending on the calibration current.

Figure 10:
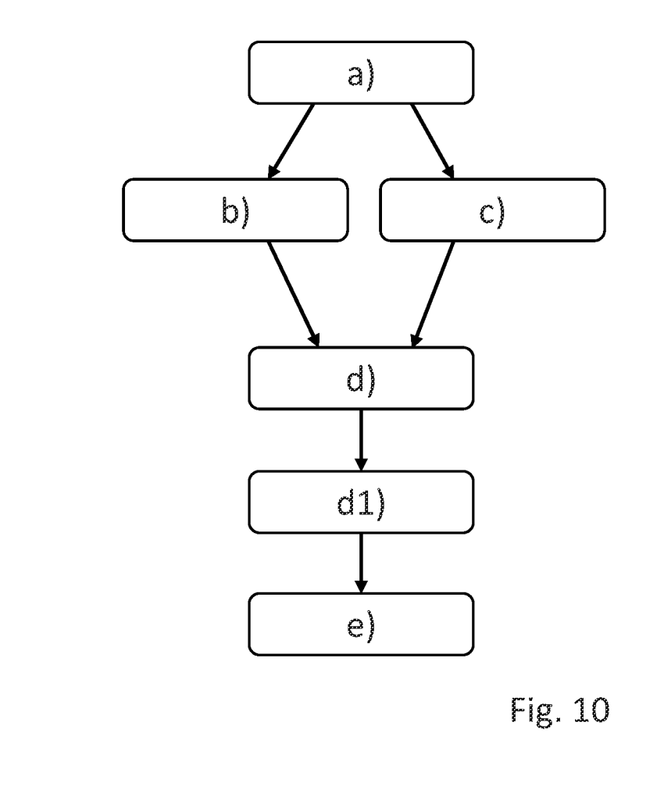
FIG. 10 shows a simplified flow chart of another embodiment of the method.

In an example of the method is shown schematically in FIG. 10. In this example, the method further comprises the step d1) to be performed before step e), with step d1) as follows: comparing, by the control unit 114, the calibration current represented by the sensor signal with a reference current stored by the transceiver 100, wherein the control unit 114 calibrates the signal generation unit 110 in step e) based on a result of the comparison, referred to as a comparison result.

In another example of the method, the signal generation unit 110 comprises an adjustable internal electrical impedance 122, wherein the control unit 114 is coupled to the signal generation unit 110 such that the internal electrical impedance 122 is controllably adjustable by the control unit 114, and the control unit 114 calibrates the signal generation unit 110 in step e) based on the comparison result by controllably adjusting the internal impedance 122 of the signal generation unit 110.

The transceivers and methods described herein may at least partially be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer-readable medium, which may include storage devices and signals, in compressed or uncompressed form.

As used herein, the term "computer" refers to any electronic device comprising a processor, such as a general-purpose central processing unit (CPU), a specific-purpose processor or a microcontroller. A computer is capable of receiving data (an input), of performing a sequence of predetermined operations thereupon, and of producing thereby a result in the form of information or signals (an output). Depending on the context, the term "computer" will mean either a processor in particular or more generally a processor in association with an assemblage of interrelated elements contained within a single case or housing.

The term "processor" or "processing unit" refers to a data processing circuit that may be a microprocessor, a co-processor, a microcontroller, a microcomputer, a central processing unit, a field programmable gate array (FPGA), a programmable logic circuit, and/or any circuit that manipulates signals (analog or digital) based on operational instructions that are stored in a memory. The term "memory" may refer to a storage circuit or multiple storage circuits such as read-only memory, random access memory, volatile memory, non-volatile memory, static memory, dynamic memory, Flash memory, cache memory, and/or any circuit that stores digital information.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A transceiver for transmitting and receiving signals, the transceiver comprising:
   a first and second terminal for coupling to signal lines,
   a signal generation unit coupled to the terminals and configured to generate a differential output voltage (Vout) between the terminals,
   a sensor unit configured to measure an electric current (Iout) when flowing through one of the terminals,
   an input interface configured to receive an input signal, and
   a control unit for controlling the signal generation unit based on the input signal,
   wherein the control unit is configured to control the signal generation unit during a calibration phase such that the signal generation unit generates a predetermined differential output voltage reference pattern between the terminals,
   wherein the sensor unit is configured to transmit a sensor signal to the control unit, the sensor signal representing the electrical current referred to as calibration current measured by the sensor unit during the calibration phase, and
   wherein the control unit is configured to calibrate the signal generation unit depending on the calibration current.

2. The transceiver of claim 1, wherein the control unit is configured to compare the calibration current represented by the sensor signal with a reference current stored by the transceiver and to calibrate the signal generation unit based on a result of the comparison, referred to as a comparison result.

3. The transceiver according to claim 2, wherein the transceiver comprises a memory unit storing reference data representing the reference current.

4. The transceiver according to claim 2, wherein the signal generation unit comprises an adjustable, electrical internal impedance, wherein the control unit is coupled to the signal generation unit such that the internal electrical impedance is adjustable under control of the control unit, and wherein the control unit is configured to calibrate the signal generation unit by controllably adjusting the internal impedance of the signal generation unit.

5. The transceiver according to claim 2, wherein the signal generation unit comprises an adjustable, electrical internal impedance, wherein the control unit is coupled to the signal generation unit such that the internal electrical impedance is adjustable under control of the control unit, and wherein the control unit is configured to calibrate the signal generation unit by controllably adjusting the internal impedance of the signal generation unit.

6. The transceiver according to claim 2, wherein the signal generation unit comprises an electrical parallel circuit of a plurality of branches connected in parallel, wherein each branch comprises a transistor and an impedance, wherein each branch is configured be enabled or disabled via the associated transistor, wherein the internal impedance of the signal generation unit is formed by the enabled branches of the parallel circuit.

7. The transceiver according to claim 2, wherein the differential output voltage reference pattern is formed of a first phase, a second phase, and a third phase that follow each other, and wherein the control unit is configured to control the signal generation unit such that mutually different differential output voltages are generated in the first to third phases, respectively, of which only one differential output voltage is zero.

8. The transceiver according to claim 1, wherein the signal generation unit comprises an adjustable, electrical internal impedance, wherein the control unit is coupled to the signal generation unit such that the internal electrical impedance is adjustable under control of the control unit, and wherein the control unit is configured to calibrate the signal generation unit by controllably adjusting the internal impedance of the signal generation unit.

9. The transceiver according to claim 8, wherein the control unit is configured to calibrate the signal generation unit based on the comparison result by controllably adjusting the internal impedance of the signal generation unit.

10. The transceiver according to claim 8, wherein the transceiver is configured to perform the following steps:
   a) setting the internal electrical impedance of the signal generation unit to a predetermined initial impedance by controllably adjusting the internal impedance at the control unit,
   b) generating the differential output voltage reference pattern between the terminals of the transceiver by controlling the signal generation unit at the control unit,
   c) measuring by the sensor unit a calibration current flowing through one of the terminals during step b),
   d) comparing at the control unit the calibration current from step c) with the reference current (Iref),
   e) decreasing the internal electrical impedance of the signal generation unit by controllably adjusting the internal electrical impedance at the control unit, if, according to step d), the calibration current is smaller than the reference current, and
   f) repeating steps b) to e) until the result of the comparison of step d) indicates that the calibration current is higher than the reference current or that the calibration current is lower than the reference current by less than a predetermined current value.

11. The transceiver according to claim 1, wherein the signal generation unit comprises an electrical parallel circuit of a plurality of branches connected in parallel, wherein each branch comprises a transistor and an impedance, wherein each branch is configured be enabled or disabled via the associated transistor, wherein the internal impedance of the signal generation unit is formed by the enabled branches of the parallel circuit.

12. The transceiver according to claim 11, wherein the control unit is coupled to the signal generation unit and configured to control the transistors of the branches of the signal generation unit for adjusting the internal impedance of the signal generation unit.

13. The transceiver according to claim 12, wherein the control unit is configured to enable or disable the branches of the signal generation unit via the transistors, respectively, for adjusting the internal impedance of the signal generation unit.

14. The transceiver according to claim 1, wherein the differential output voltage reference pattern is formed of a first phase, a second phase, and a third phase that follow each other, and wherein the control unit is configured to control the signal generation unit such that mutually different differential output voltages are generated in the first to third phases, respectively, of which only one differential output voltage is zero.

15. The transceiver according to claim 14, wherein the control unit is configured to control the signal generation unit such that in the first phase a first predetermined electrical voltage is applied between the terminals, in the second phase a second predetermined electrical voltage, inverse to the first voltage, is applied between the terminals, and in the third phase a zero differential output voltage is applied between the terminals.

16. The transceiver of claim 15, wherein a first duration of the first phase and a second duration of the second phase are equal in length, and a third duration of the third phase is twice as long as the first duration.

17. The transceiver of claim 14, wherein a first duration of the first phase and a second duration of the second phase are equal in length, and a third duration of the third phase is twice as long as the first duration.

18. A method for a transceiver having first and second terminals for coupling to signal lines, a signal generation unit, a control unit, and a sensor unit, the method comprising the steps of:
   a) generating a differential output voltage (Vout) between the terminals by the signal generation unit,
   b) measuring an electric current (Iout) flowing through one of the terminals by the sensor unit,
   c) controlling the signal generation unit during a calibration phase by the control unit so that the signal generation unit generates a predetermined differential output voltage reference pattern (140) between the terminals,
   d) transmitting a sensor signal from the sensor unit to the control unit, the sensor signal representing the electrical current measured by the sensor unit during the calibration phase, referred to as the calibration current, and
   e) calibrating, by the control unit, the signal generation unit depending on the calibration current.

19. The method according to claim 18, wherein the method further comprises the step d1) to be performed before step e): d1) comparing, by the control unit, the calibration current represented by the sensor signal with a reference current stored by the transceiver, wherein the control unit calibrates the signal generation unit in step e) based on a result of the comparison, referred to as a comparison result.

20. The method of claim 19, wherein the signal generation unit comprising an adjustable internal electrical impedance, wherein the control unit is coupled to the signal generation unit such that the internal electrical impedance is controllably adjustable by the control unit, and the control unit calibrates the signal generation unit in step e) based on the comparison result by controllably adjusting the internal impedance of the signal generation unit.

* * * * *